(12) United States Patent
Hu et al.

(10) Patent No.: US 8,563,201 B2
(45) Date of Patent: Oct. 22, 2013

(54) MASK, MANUFACTURING METHOD THEREOF AND MASK HAZE MONITORING METHOD

(75) Inventors: Huayong Hu, Beijing (CN); Shijian Zhang, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 56 days.

(21) Appl. No.: 13/411,474

(22) Filed: Mar. 2, 2012

(65) Prior Publication Data

US 2013/0108948 A1    May 2, 2013

(30) Foreign Application Priority Data

Oct. 27, 2011 (CN) .......................... 2011 1 0330676

(51) Int. Cl.
*G03F 1/26* (2012.01)
*G03F 1/36* (2012.01)

(52) U.S. Cl.
USPC ............................................... 430/5; 430/30

(58) Field of Classification Search
USPC ........................................................ 430/5, 30
See application file for complete search history.

(56) References Cited

U.S. PATENT DOCUMENTS 7,879,537 B1 * 2/2011 Rigby et al. ................... 430/394
8,316,329 B1 * 11/2012 Rigby et al. ................... 716/55

* cited by examiner

*Primary Examiner* — Christopher Young
(74) *Attorney, Agent, or Firm* — Innovation Counsel LLP

(57) ABSTRACT

A mask and methods for making the mask and monitoring mask haze using the mask are provided. The mask includes chip areas that are separated by scribe lanes. A scribe lane includes a monitoring area that contains a primary pattern and an associated assist feature. The assist feature includes two parallel scattering bars. Regions in the monitoring area other than the primary pattern and the associated assist feature are covered with a phase shift layer having a transmittance smaller than that of the primary pattern and the assist feature. When the mask is exposed to a light source, the assist feature is not transferred onto a wafer but cooperates with the primary pattern to generate a primary transferred pattern on the wafer. When a region between the two scattering bars has mask haze thereon, a defect identification pattern is generated on the wafer near the primary transferred pattern following exposure.

20 Claims, 7 Drawing Sheets

MASK, MANUFACTURING METHOD THEREOF AND MASK HAZE MONITORING METHOD

CROSS-REFERENCES TO RELATED APPLICATIONS

This application claims priority to Chinese Patent Application No. 201110330676.3, filed on Oct. 27, 2011 and entitled "Mask, Manufacturing Method thereof and Mask Haze Monitoring Method", which is incorporated herein by reference in its entirety.

BACKGROUND OF THE INVENTION

1. Field of the Invention

The present invention generally relates to the field of semiconductor manufacturing, and more specifically, to a mask used in a semiconductor manufacturing process and methods for making the mask and for the haze monitoring using the mask.

2. Description of the Related Art

During the manufacture of semiconductor integrated circuits, photolithography is a very important process. In the photolithography, a pattern (such as a pattern of metal wires or contact holes) with a predefined design is firstly formed on one or more masks, and the pattern on the mask is then transferred onto a photoresist layer on a wafer using a photolithographic tool (e.g. a step-and-scan photolithographic tool) through an exposure process.

During manufacturing processes, mask contamination has always been a concern. Since the pattern in a mask is repeatedly transferred onto a wafer, mask contamination will cause defects in a large number of semiconductor chips, and severely affects process yield. Among different types of mask contamination, haze is the most common contamination which has the severest effect and is difficult to be avoided. Generally, sulphuric acid is used in mask cleaning, which may cause sulphate ions to be left on the mask. These residual sulphate ions will crystallize and thus produce mask haze during the use of the mask. For example, the residual sulphate ions on the mask will associate with cation such as ammonium ions in the environment, thereby forming a crystal such as ammonium sulphate using a DUV light source. As the crystal grows to a certain size (for example, when its size is equivalent to the pattern size on the mask), the precision of pattern transfer will be affected, which consequently lowers the yield of integrated chips. With the continuous shrinking of the size of semiconductor devices, exposure wavelength in photolithography decreases continuously, and thus the effect by haze becomes increasingly severer. For advanced integrated circuit (IC) processes, since more and more semiconductor layers require the use of a 193 nm exposure wavelength, the probability of occurrences of chip defects caused by mask haze will significantly increase.

Thus, it is necessary to detect contamination (especially, mask haze) on a mask, and then, based on the detection result, to remove the contamination by cleaning once a contamination is found.

A conventional method for detecting mask haze is to employ a dedicated mask detection system, such as STARlight-2™ mask inspection system available from KLA-Tencor Inc. This system can perform offline inspection for mask haze. However, this inspection method is very expensive and time consuming. The inspection of one piece of mask usually takes 2 to 4 hours, which not only decreases the production efficiency of semiconductor devices, but also increases the cost. Moreover, since inspection of the mask is regularly carried out offline, it is hard to find mask haze in time.

Another method for detecting mask haze is to manually inspect whether or not patterns in chip areas of a wafer have suffered from mask haze defects as repeating defects in different shots. However, this method is time consuming, requires additional manpower, and does not provide sufficient accuracy. In addition, this method is only capable of detecting mask haze of large size which has already resulted in chip defects, but fails to detect the mask haze before the mask haze causes chip defects. In practice, when mask haze is detected by means of this method, a large number of defect chips have already been produced, which leads to yield loss.

BRIEF SUMMARY OF THE INVENTION

In view of the above, it is needed to provide an improved solution for detecting mask haze, which can effectively detect mask haze in time, so as to remove the haze as early as possible and improve product yield.

According to an embodiment of the invention, a mask having scribe lanes containing monitoring areas and chip areas separated by the scribe lanes is provided. The mask includes at least one primary pattern having at least one associated assist feature disposed in a monitoring area, the associated assist feature includes at least two parallel scattering bars, wherein regions in the monitoring area other than the at least one primary pattern and the at least one associated assist feature are covered with a phase shift layer having a transmittance smaller than a transmittance of the at least one primary pattern and the at least one associated assist feature. The at least one primary pattern and the at least one associated assist feature have sizes and relative positions that are designed such that when the mask without contamination is exposed to a light source, the at least one associated assist feature is not transferred onto a wafer but cooperates with the at least one primary pattern to generate a primary transferred pattern on the wafer corresponding to the at least one primary pattern.

In an embodiment, the sizes and the relative positions of the at least one primary pattern and the at least one associated assist feature are further designed such that when a mask haze appears on a region between the at least two parallel scattering bars of the at least one associated assist feature, a defect identification pattern is generated near the primary transferred pattern on the wafer after the exposure of the mask.

In an embodiment, the defect identification pattern is generated due to a change of phase shift characteristics of the region caused by the mask haze thereon.

In an embodiment, the monitoring area is disposed in an outermost scribe lane of the mask.

In an embodiment, each of the monitoring areas has a plurality of primary patterns, and a spacing between two adjacent primary patterns is larger than five times a size of one of the primary patterns.

In an embodiment, a periphery of the monitoring area does not exceed a boundary of the scribe lane in which the monitoring area is located.

In an embodiment, the monitoring area has a rectangular shape, and the shortest distance between any side of the monitoring area and the boundary of the scribe lane in which the monitoring area is located ranges from 1 µm to 10 µm.

In an embodiment, the light source for the mask is an ArF laser having a wavelength of 193 nm.

In an embodiment, the at least one primary pattern comprises one or more circular, square, or rectangular shapes.

In an embodiment, a pattern in the chip area comprises one or more circular, square, or rectangular shapes.

In an embodiment, for each primary pattern, the at least one associated assist feature comprises a plurality of assist features disposed on one side of the at least one primary pattern.

In an embodiment, for each primary pattern, the at least one associated assist feature comprises a plurality of assist features disposed on two opposite sides of the at least one primary pattern.

In an embodiment, for each primary pattern, the at least one associated assist feature comprises a plurality of assist features being distributed around the at least one primary pattern.

In an embodiment, the material of the phase shift layer comprises $MoSi$, $TaSi_2$, $TiSi_2$, $Fe_2O_3$, $Mo$, $Nb_2O_5$, $Ti$, $Ta$, $CrN$, $MoO_2$, $MoN$, $Cr_2O_2$, $TiN$, $ZrN$, $TiO_2$, $TaN$, $Ta_2O_5$, $NbN$, $Si_2N_4$, $Al_2O_2N$, $Al_2O_2R$, or a combination thereof.

In an embodiment, the defect identification pattern comprises a circular shape having a size smaller than a size of the primary transferred pattern.

In an embodiment, an outermost scribe lane of the mask comprises more than five monitoring areas.

In an embodiment, the phase shift layer has a transmittance of about 4% to about 8%.

In an embodiment, the phase shift layer is provided such that a light passing through the phase shift layer has a phase shift of about 165° to about 190° relative to a light passing through the at least one primary pattern or the at least one associated assist feature.

In an embodiment, the phase shift layer is provided such that the light passing through the phase shift layer has a phase shift of 180° relative to the light passing through the at least one primary pattern or the at least one associated assist feature.

According to another embodiment of the invention, a method for manufacturing the above-described mask is provided. The method includes providing a transparent substrate; forming a patterned phase shift layer on the transparent substrate as a light barrier layer for the mask, wherein the monitoring area having the primary pattern and the assist feature disposed therein is formed in the scribe lane simultaneously with the formation of patterns in the chip areas.

According to yet another embodiment of the invention, a method for monitoring mask haze using the above-described mask is provided. The method includes transferring patterns on the mask onto a wafer coated with a photoresist through exposure, and inspecting the transferred patterns formed on the wafer to detect a defect identification pattern. In the event that a defect identification pattern at the vicinity of a primary transferred pattern on the wafer corresponding to the primary pattern in the monitoring area of the mask is detected, the mask is determined to have haze. In the event that a defect identification pattern at the vicinity of a primary transferred pattern on the wafer corresponding to the primary pattern in the monitoring area of the mask is not detected or not present, the mask is determined to be free of haze.

In an embodiment, the method further comprises cleaning the mask if it is determined that the mask has haze.

In an embodiment, the inspecting comprises using a scanning electron microscope to obtain an online image of the wafer and inspecting the image.

In an embodiment, the inspecting comprises performing a defect scan for the wafer using an optical method.

Many benefits are achieved by way of the present invention over the conventional techniques. For example, the mask according to the present invention provides the ability to monitor mask haze online, thereby effectively detecting mask haze in time.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be more clearly understood based on the following detailed description with reference to the drawings, in which.

DETAILED DESCRIPTION OF THE INVENTION

Figure 1:
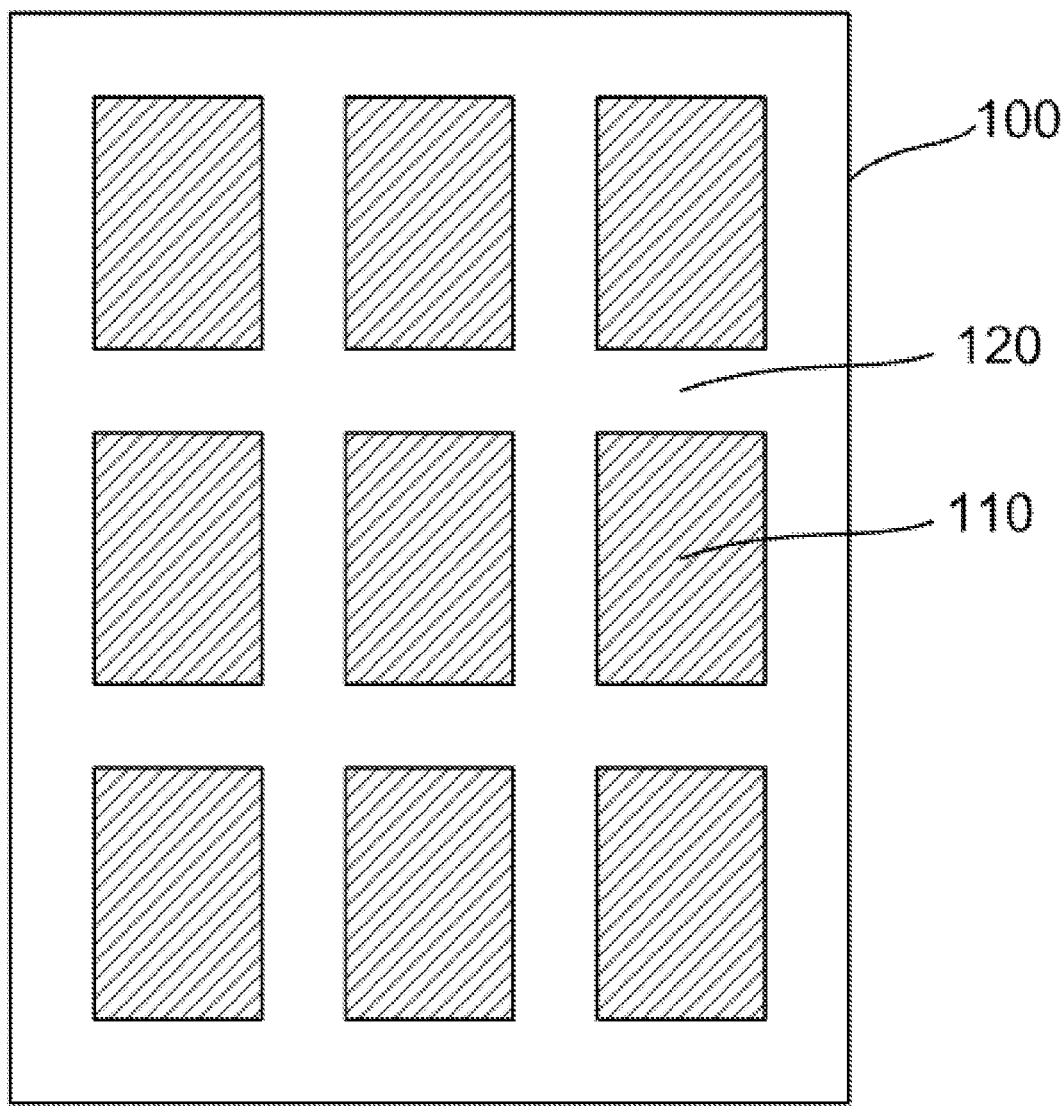
FIG. 1 is a top-view diagram of a typical mask in the prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

FIG. 1 is a top-view diagram of a typical mask 100. The mask 100 generally comprises chip areas 110 and scribe lanes 120. A chip area 110 generally has a pattern to be transferred onto a wafer for forming a semiconductor device (such as a pattern for contact holes, a pattern for metal wires, or the like). The chip areas 110 are separated by the scribe lanes 120, for facilitating subsequent wafer dicing into individual chips during the dicing process. In addition, additional patterns such as alignment marks can be formed in the scribe lanes 120 to achieve corresponding additional functions. The mask 100 can be various masks as known by one of ordinary skill in the art, which preferably is an attenuated phase-shift mask. It would be appreciated that, FIG. 1 is merely illustrative, and the respective shapes, arrangements and numbers of the chip areas 100 and the scribe lanes 120 can be modified as necessary, not limited to those shown in the figure.

Through experimentation, the inventor has found that, mask haze usually appears primarily in the scribe lanes of the mask, especially in the outermost scribe lanes along the mask edge (i.e. the scribe lanes adjacent to the pellicle frame for the mask), and then gradually appears in the chip areas. Moreover, mask haze is usually small at first and will not affect the transferred chip pattern on the wafer, but it may then grow quickly and will distort the transferred chip pattern on the wafer, resulting in chip defects.

To overcome the above described problems, the inventor provides monitoring areas for monitoring mask haze in the scribe lanes of the mask, such that mask haze can be detected and removed by cleaning before it adversely affects the chips. As a result, occurrences of chip defects can be avoided to a great extent and chip yield can be significantly enhanced.

Figure 2:
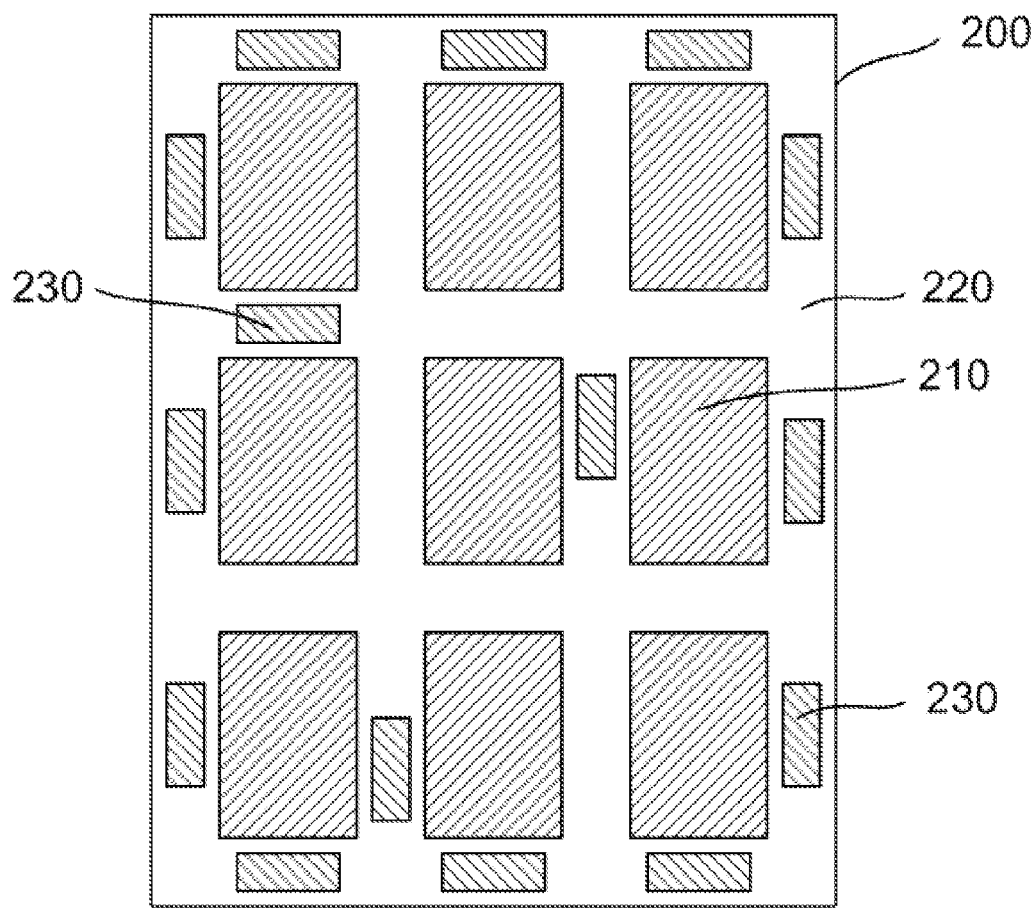
FIG. 2 is a top-view diagram of a mask which has monitoring areas in scribe lanes, according to an embodiment of the present invention.

FIG. 2 is a top-view diagram of a mask 200 which has monitoring areas in scribe lanes, according to an embodiment of the present invention. As shown, the mask 200 comprises chip areas 210 and scribe lanes 220. The scribe lines 220 comprise one or more monitoring areas 230. The monitoring areas 230 can monitor mask haze that appears therein. Thus, the scribe lanes 220 may include a multitude of monitoring areas 230 as necessary, so as to enhance the probability of detecting mask haze. Preferably, the monitoring areas 230 are mostly located in the outermost scribe lanes of the mask 200, as shown in FIG. 2, so that mask haze can be detected as early as possible. In an example embodiment, the outermost scribe lane of the mask 200 can include more than five monitoring areas.

Although FIG. 2 shows rectangular monitoring areas 230, the shape of the monitoring areas is not limited to those, but can be any appropriate shape, such as circle, polygon or irregular shape. In order not to interfere with patterns in the chip areas, the periphery of each of the monitoring areas 230 does not extend beyond the boundary of the corresponding scribe lane 220, in a preferred embodiment. In addition, in order to cover a larger area to enhance the probability of detecting mask haze, the boundary of a monitoring area 230 can be designed as close as possible to the boundary of the scribe lane within which it is located. For example, the shortest distance between any side of the monitoring area 230 and the boundary of the scribe lane within which it is located can be about 1 μm to about 10 μm.

For the purpose that the occurrence of mask haze can be detected as early as possible, a monitoring pattern which, compared with the patterns in the chip areas, is more sensitive to mask haze can be disposed in the monitoring area. A pattern arrangement in the monitoring area will be described below in reference with FIGS. 3A and 3B.

Figure 3A:
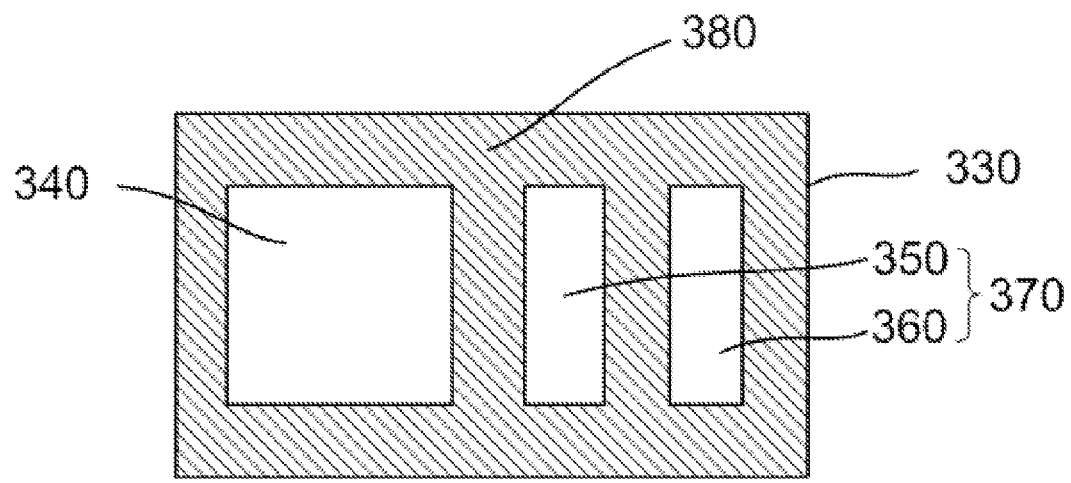
FIGS. 3A and 3B are diagrams respectively showing a pattern disposed in the monitoring area and a corresponding transferred pattern on a wafer, according to an embodiment of the present invention.

FIG. 3A is a diagram of a monitoring pattern that can be disposed in the monitoring area according to an embodiment of the present invention. As shown in FIG. 3A, a primary pattern 340 and an assist feature 370, which together constitute a monitoring pattern, are disposed within the monitoring area 330. The assist feature 370 is located in the vicinity of the primary pattern 340 and may include two parallel scattering bars 350 and 360. In an embodiment, the assist feature 370 can comprise more than two scattering bars, as deemed necessary. Preferably, the primary pattern 340 and the assist feature 370 can both be transparent.

It would be appreciated that, although the primary pattern is shown in FIG. 3A as having a square shape, the present invention is not limited to this. The primary pattern can have any suitable shape or a combination of shapes, as long as it can be transferred onto a wafer through exposure. If the pattern in the chip areas of the mask includes circular or rectangular shapes (for example, in a mask for forming contact holes or vias), considering the characteristics of the light source and the imaging system suitable for this mask, the primary pattern 340 in the monitoring area preferably includes one or more circular or rectangular shapes, so as to improve the imaging quality.

It would also be appreciated that, although only one primary pattern and one associated assist feature are shown in FIG. 3A, each primary pattern can also associated with a plurality of assist features, and a plurality of primary patterns together with their associated assist features can be disposed in one monitoring area. This will be described below in reference with FIGS. 5A through 5D with more examples.

Regions in the monitoring area 330 other than the primary and assist features 340 and 370 are covered with a phase shift layer 380. The phase shift layer 380 has a transmittance lower than a transmittance of the primary pattern 340 and the assist feature 370, and can serve as a light barrier layer for the mask. Preferably, the transmittance of the phase shift layer 380 can be about 4% to about 8%. The phase shift layer 380 can cause light passing through it to have a predetermined phase shift, so as to improve the quality of the transferred pattern on the wafer. For example, the material and the thickness of the phase shift layer 380 can be designed based on the exposure wavelength such that the light passing through the phase shift layer 380 has a phase shift of about 165° to about 190° relative to the light passing through the primary pattern 340 and the assist feature 370, which thus enhances the contrast of the transferred pattern on the wafer. Ideally, the phase shift can be 180°. Examples of the material of the phase shift layer 380 can include $MoSi$, $TaSi_2$, $TiSi_2$, $Fe_2O_3$, $Mo$, $Nb_2O_5$, $Ti$, $Ta$, $CrN$, $MoO_2$, $MoN$, $Cr_2O_2$, $TiN$, $ZrN$, $TiO_2$, $TaN$, $Ta_2O_5$, $NbN$, $Si_3N_4$, $Al_2O_2N$, $Al_2O_2R$, or a combination thereof. The formation and use of the phase shift layer on the mask are known by one of ordinary skill in the art, and thus further detailed descriptions thereof are omitted herein for the sake of brevity.

Figure 3B:
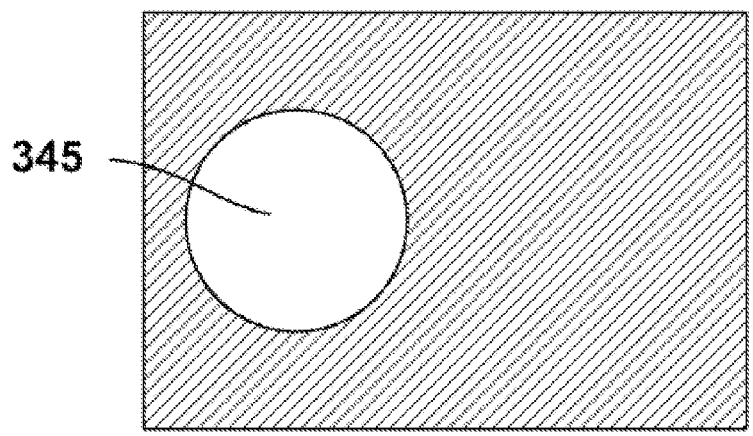

Generally, the purpose of providing the assist feature 370 is to further improve the contrast of a primary transferred pattern 345 (see FIG. 3B) on the wafer that is transferred through exposure to a light source and corresponds to the primary pattern 340. More specifically, the scattering bars 350 and 360 in the assist feature 370 can help eliminate diffraction side lobes of the light transmitting through the primary pattern 340, thereby enhancing the contrast of the primary transferred pattern 345. The sizes of the scattering bars 350 and 360 are designed to be smaller than the minimum size that can be projected using the exposure light source, and thus, the assist feature 370 will not be transferred onto the wafer under a normal situation (i.e., in a situation where the mask has no contamination), as shown in FIG. 3B. Thus, the sizes and the relative positions of the primary pattern 340 and the associated assist feature 370 should be designed such that when the mask 300 without contamination is exposed to a light source, the assist feature 370 is not transferred onto the wafer, but cooperates with the primary pattern 340 to generate a primary transferred pattern 345 on the wafer which corresponds to the primary pattern 340. Here, due to factors such as diffraction of light, the shape of the primary transferred pattern 345 on the wafer may be different from the shape of the primary pattern 340 on the mask. Thus, for example, the primary pattern 340 shown in FIG. 3A has a square shape and the primary transferred pattern 345 shown in FIG. 3B has a circular shape. However, the present invention is not limited to this; the transferred pattern can have other shapes depending on design parameters. Specific parameters of the sizes and relative positions of the primary pattern 340 and the associated assist feature 370 depend on the wavelength of the exposure light source, the optical system for imaging, and the like. One of ordinary skill in the art can easily define the desired parameters according to the applied environment. In an exemplary embodiment, the above parameters for the mask can be designed for applications where the exposure light source is an ArF laser having a wavelength of 193 nm.

With such pattern arrangement, small mask haze that appears in the monitoring area 330 can be easily detected with high sensitivity, especially mask haze in the region between the scattering bars. Specifically, when a mask haze appears in the region between the scattering bars, the transferred pattern on the wafer will be different from that of FIG. 3B. Detailed descriptions will be made below in reference with FIGS. 4A and 4B.

Figure 4A:
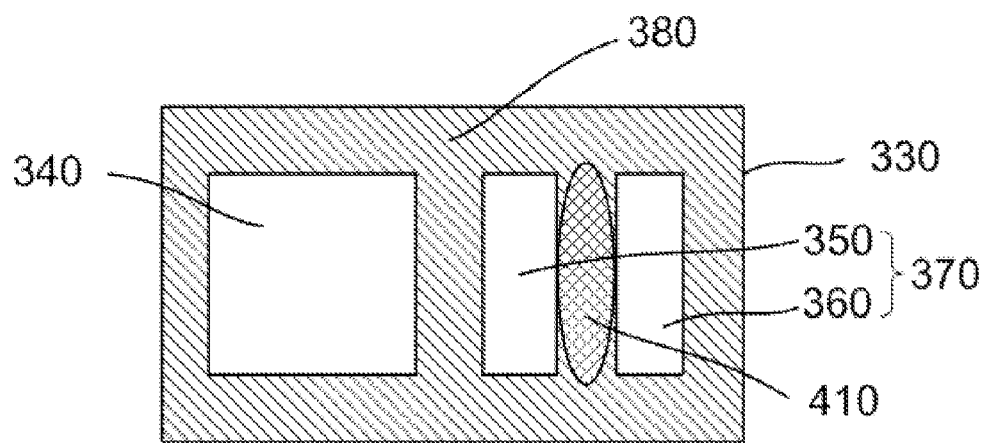
FIGS. 4A and 4B are diagrams respectively showing a monitoring area having haze and a corresponding transferred pattern on a wafer, according to an embodiment of the present invention.
Figure 4B:
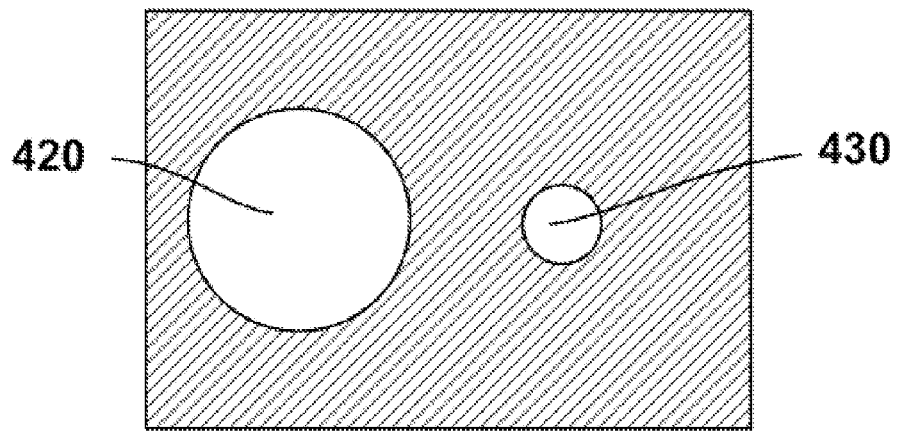

FIGS. 4A and 4B are diagrams respectively showing a monitoring area having mask haze and a corresponding transferred pattern on a wafer, according to an embodiment of the present invention.

FIG. 4A is similar to FIG. 3A, with one difference that haze 410 has appeared in the region between the scattering bars 350 and 360 in the monitoring area 330. Correspondingly, the pattern on the wafer transferred through exposure has changed. As shown in FIG. 4B, a pattern 430 is generated in the vicinity of the primary transferred pattern 420. Since the pattern 430 occurs due to haze 410, it is referred to as a defect identification pattern in this specification. The inventor has found that the defect identification pattern 430 occurs because haze 410 has changed phase shift characteristics of the region between the scattering bars 350 and 360. Specifically, haze 410 introduces an additional phase shift such that the phase relationship between the light transmitting through the region and the light transmitting through the assist feature 370 (i.e., scattering bars 350 and 360) has changed, which makes the side lobes of the light transmitting through the primary pattern 340 not be well suppressed and thus the defect identification pattern 430 occurs in the vicinity of the primary transferred pattern 420. It has been found that, the defect identification pattern 430 has generally a circular shape with a size smaller than that of the primary transferred pattern 420.

It would be appreciated that, although haze 410 shown in FIG. 4A is an elliptical shape, this is merely illustrative, and in practice, haze having various shapes and sizes can be generated. However, as long as haze occurs in the region between scattering bars, a defect identification pattern will be generated, and thus the presence of haze on the mask can be detected. Therefore, the monitoring area with this pattern arrangement can detect very small haze and has high sensitivity.

Further, in order to enhance the probability of detecting haze, in addition to including more monitoring areas in the scribe lanes, a plurality of primary patterns and their associated assist features can be disposed in each monitoring area. Preferably, the spacing between adjacent primary patterns can be larger than five time a size of one of the primary patterns, which can facilitate the arrangement of the assist features.

In addition, although the assist feature is disposed only on one side of the primary pattern in FIGS. 3A and 4A, more assist features can be disposed on two opposite sides of each primary pattern, or a plurality of assist features can be distributed around each primary pattern. In this way, the probability of detecting haze can be further enhanced.

Figure 5A:
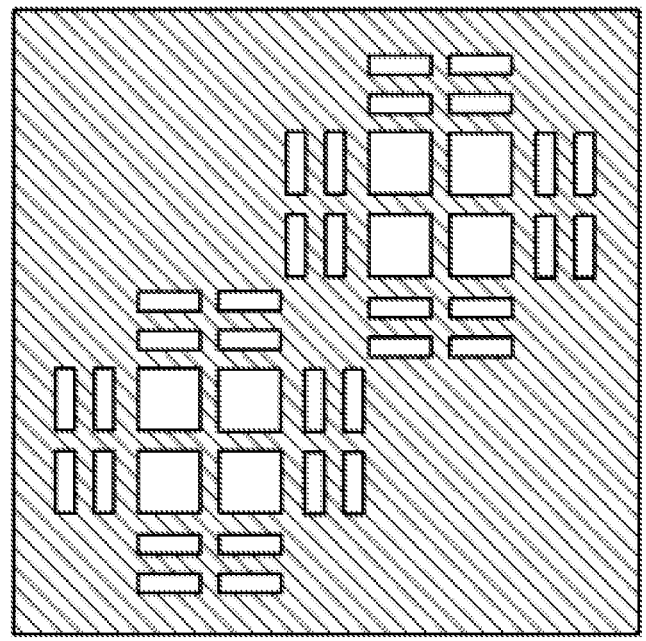
FIGS. 5A through 5D show examples of pattern arrangements that can be disposed in the monitoring area, according to embodiments of the present invention.
Figure 5B:
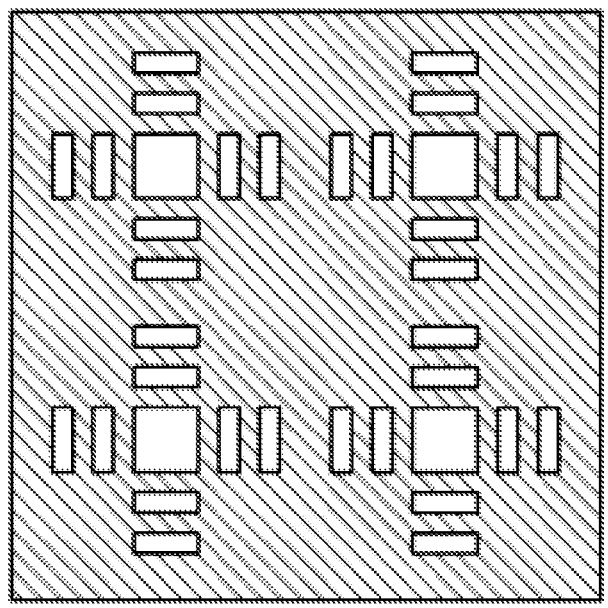

FIGS. 5A through 5D show examples of pattern arrangements that can be disposed in the monitoring area, according to embodiments of the present invention. The shaded area denotes the phase shift layer while the blank areas represent arrays formed by primary patterns and their associated assist features. FIG. 5A shows eight primary patterns that are grouped in two groups, each group having four primary patterns. Each primary pattern has one associated assist feature that is located on one side of the primary pattern. FIG. 5B shows four primary patterns, each primary pattern having four associated assist features. The four associated assist feature are located on four sides of each primary pattern.

Figure 5C:
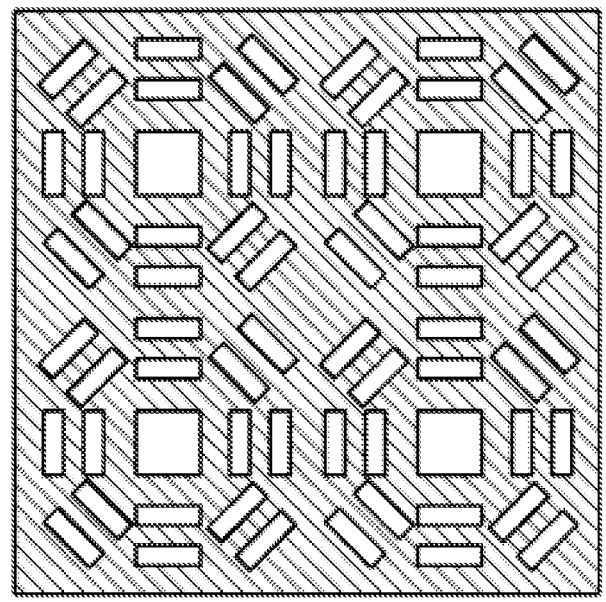

FIG. 5C shows another exemplary haze monitoring configuration according to an embodiment of the present invention. As shown, the configuration includes four primary patterns, each primary pattern has eight associated assist features that are distributed around the primary pattern.

Figure 5D:
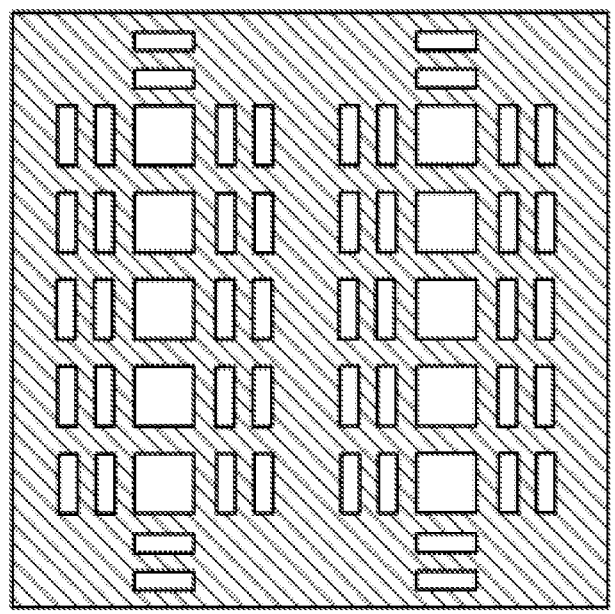

FIG. 5D shows yet another exemplary haze monitoring configuration according to an embodiment of the present invention. As shown, the haze monitoring configuration includes 10 primary patterns that are grouped in two groups. Each group includes five primary patterns that are arranged in a column, wherein the top and bottom primary patterns each have three associated assist features on each side, while the three primary patterns in the middle of the column each have two assist features disposed on the two opposite sides.

It would be appreciated that, FIGS. 5A through 5D merely show examples of haze monitoring patterns that can be disposed in the monitoring area and the shown example should not unduly limit the scope of the claims herein. In practice, various possible patterns can be used as necessary based on the arrangement of the scribe lanes. For example, although the primary patterns are shown as an array of columns, they can be arranged as an array of rows as well. The number of primary patterns may also vary depending upon applications. For example, the number can be less than or greater than five in a column or in a row in some embodiments. Moreover, the shapes and sizes of different primary patterns as well as assist features in each monitoring area can be different from each other.

The exemplary structures of the mask according to the embodiments of the present invention have been described above in reference with FIGS. 2 through 5D. The above mask can be manufactured using various methods known in the art.

Since the monitoring area in the scribe lane of the mask according to the embodiments of the present invention uses a phase shift layer as a light barrier layer, preferably, the chip area can also use a phase shift layer as a light barrier layer. In this way, the pattern in the monitoring area is formed simultaneously with the formation of the pattern in the chip area, without adding any additional process step or any other kind of material, which thus will not bring extra burdens to the production process. Moreover, employing a phase shift layer as a light barrier layer in the chip area can improve the quality of the transferred chip pattern on the wafer.

Thus, according to one embodiment, it is provided a method for manufacturing the mask described above with reference to FIGS. 2 through 5D. According to this method, a transparent substrate is firstly provided, and then a patterned phase shift layer is formed on the transparent substrate as a light barrier layer for the mask, wherein the monitoring area within which the primary pattern and the assist feature are disposed is formed in the scribe lane simultaneously with the formation of pattern in the chip area.

Figure 6:
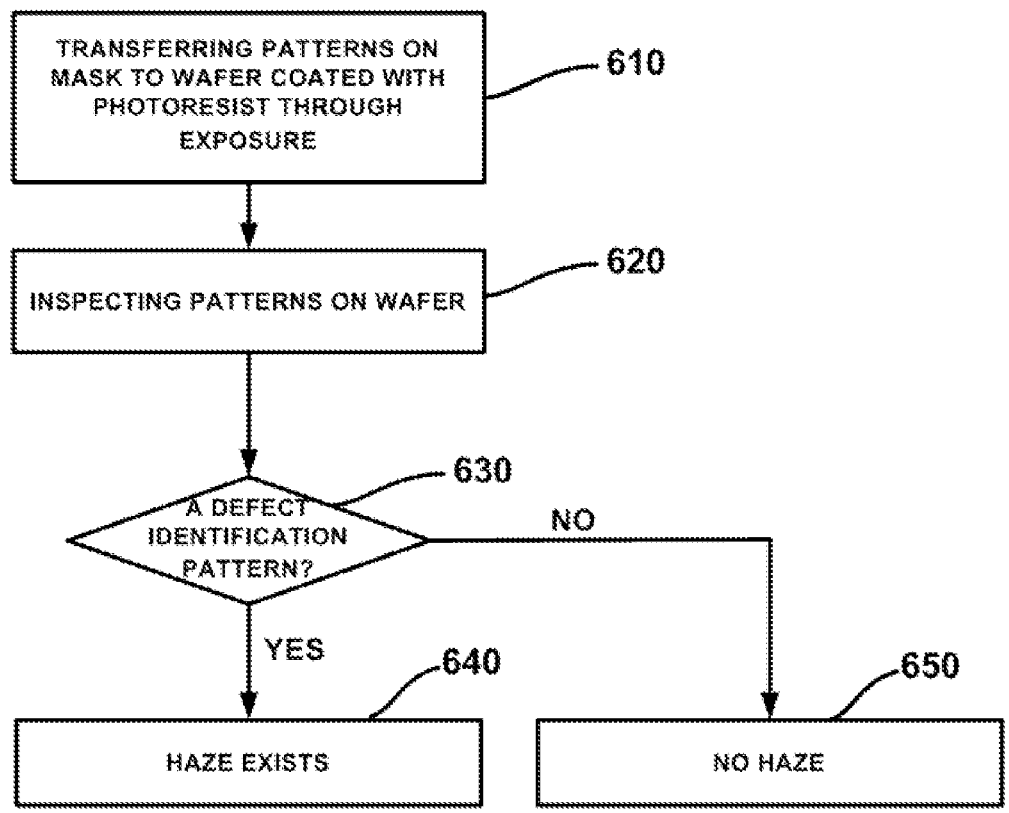
FIG. 6 is a simplified flowchart illustrating a method for monitoring mask haze according to an embodiment of the present invention.

FIG. 6 is a simplified flowchart diagram of a method for monitoring mask haze according to an embodiment of the present invention. The monitoring method can be performed using the mask described above with reference to FIGS. 2 through 5D.

As shown in the flowchart of FIG. 6, in step 610, patterns on the mask are transferred through exposure onto a wafer coated with photoresist. Then, the method proceeds to step 620, in which the patterns on the wafer are inspected. One of ordinary skill in the art can employ various methods to inspect the patterns on the wafer. For example, an online image of the wafer can be obtained using a scanning electron microscope and then the image can be inspected. Alternatively, a defect scan can be performed for the wafer using an optical method (such as illuminating with ultraviolet). Next, in step 630, it is determined whether or not a defect identification pattern is present at the vicinity of the primary transferred pattern on the wafer corresponding to the primary pattern in the monitoring area of the mask. If the defect identification pattern is determined to be present, it is determined that the mask has haze (step 640); otherwise, it is determined that the mask is free of haze (step 650). Preferably, if it is determined that the mask has haze, a cleaning process will be carried out for the mask.

As mentioned before, haze usually appears firstly in the scribe lanes. At this point, the transfer of pattern in the chip area is not affected because haze may not yet appear in the chip area and also because the haze is small. Taking this into account, the present disclosure disposes monitoring areas in the scribe lanes of the mask that have a specified pattern and are more haze-sensitive than the chip areas, and then inspects the corresponding transferred patterns on the wafer, thereby realizing online monitoring for haze to detect haze as early as possible. Once it is detected that haze appears in the scribe lanes, the mask can be cleaned in time, which can avoid the occurrence of defect chips to a great extent and thus significantly enhance chip yield. Moreover, the solution according to the present disclosure exploits the blank portion of the mask, which can reduce the cost for detecting haze and shorten the time consumed for the detection in a simple way.

So far, the mask, the corresponding method for manufacturing the mask and the method for monitoring haze using this mask according to the embodiments of the present invention have already been described. In order not to obscure the concept of the present invention, details known in the art are not described. One of ordinary skill in the art would know how to implement the technical solution disclosed herein based on the above descriptions.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the claims.

What is claimed is:

1. A mask having scribe lanes containing monitoring areas and chip areas separated by the scribe lanes, the mask comprising:
at least one primary pattern having at least one associated assist feature disposed in a monitoring area, the associated assist feature comprising at least two parallel scattering bars,
wherein regions in the monitoring area other than the at least one primary pattern and the at least one associated assist feature are covered with a phase shift layer having a transmittance smaller than a transmittance of the at least one primary pattern and the at least one associated assist feature, and
wherein sizes and relative positions of the at least one primary pattern and the at least one associated assist feature are designed such that when the mask without contamination is exposed to a light source, the at least one associated assist feature is not transferred onto a wafer but cooperates with the at least one primary pattern to generate a primary transferred pattern on the wafer corresponding to the at least one primary pattern.

2. The mask of claim 1, wherein the sizes and the relative positions of the at least one primary pattern and the at least one associated assist feature are further designed such that when mask haze appears on a region between the at least two parallel scattering bars of the at least one associated assist feature, a defect identification pattern is generated near the primary transferred pattern on the wafer after the exposure of the mask.

3. The mask of claim 2, wherein the defect identification pattern is generated due to a change of phase shift characteristics of the region caused by the mask haze thereon.

4. The mask of claim 1, wherein the monitoring area is disposed in an outermost scribe lane of the mask.

5. The mask of claim 1, wherein each of the monitoring areas has a plurality of primary patterns, and a spacing between two adjacent primary patterns is larger than five times a size of one of the primary patterns.

6. The mask of claim 1, wherein a periphery of the monitoring area does not exceed a boundary of the scribe lane in which the monitoring area is located.

7. The mask of claim 6, wherein the monitoring area has a rectangular shape, and the shortest distance between any side of the monitoring area and the boundary of the scribe lane in which the monitoring area is located ranges from 1 µm to 10 µm.

8. The mask of claim 1, wherein the light source for the mask is an ArF laser having a wavelength of 193 nm.

9. The mask of claim 1, wherein the at least one primary pattern comprises one or more circular or rectangular shapes.

10. The mask of claim 1, wherein a pattern in the chip area comprises one or more circular or rectangular shapes.

11. The mask of claim 1, wherein the at least one associated assist feature comprises a plurality of assist features disposed on one side of the at least one primary pattern.

12. The mask of claim 1, wherein the at least one associated assist feature comprises a plurality of assist features disposed on two opposite sides of the at least one primary pattern.

13. The mask of claim 1, wherein the at least one associated assist feature comprises a plurality of assist features being distributed around the at least one primary pattern.

14. The mask of claim 1, wherein the phase shift layer comprises MoSi, $TaSi_2$, $TiSi_2$, $Fe_2O_3$, Mo, $Nb_2O_5$, Ti, Ta, CrN, $MoO_2$, MoN, $Cr_2O_2$, TiN, ZrN, $TiO_2$, TaN, $Ta_2O_5$, NbN, $Si_2N_4$, $Al_2O_2N$, $Al_2O_2R$, or a combination thereof.

15. The mask of claim 2, wherein the defect identification pattern comprises a circular shape having a size smaller than a size of the primary transferred pattern.

16. The mask of claim 1, wherein an outermost scribe lane of the mask comprises more than five monitoring areas.

17. The mask of claim 1, wherein the phase shift layer has a transmittance of about 4% to 8%.

18. The mask of claim 1, wherein the phase shift layer is provided such that a light passing through the phase shift layer has a phase shift of about 165° to 190° relative to a light passing through the at least one primary pattern or the at least one associated assist feature.

19. The mask of claim 18, wherein the phase shift layer is provided such that the light passing through the phase shift layer has a phase shift of 180° relative to the light passing through the at least one primary pattern or the at least one associated assist feature.

20. A method for manufacturing the mask of claim 1, comprising:
  providing a transparent substrate; and
  forming a patterned phase shift layer on the transparent substrate as a light barrier layer for the mask, wherein the monitoring area having the primary pattern and the assist feature disposed therein is formed in the scribe lane simultaneously with the formation of patterns in the chip areas.

* * * * *